US009305917B1

(12) United States Patent
Curatola et al.

(10) Patent No.: US 9,305,917 B1
(45) Date of Patent: Apr. 5, 2016

(54) HIGH ELECTRON MOBILITY TRANSISTOR WITH RC NETWORK INTEGRATED INTO GATE STRUCTURE

(71) Applicant: Infineon Technologies Austria AG, Villach (AT)

(72) Inventors: Gilberto Curatola, Villach (AT); Oliver Haeberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/674,096

(22) Filed: Mar. 31, 2015

(51) Int. Cl.
*H01L 29/15* (2006.01)
*H01L 27/02* (2006.01)
*H01L 27/07* (2006.01)
*H01L 29/778* (2006.01)
*H01L 29/861* (2006.01)
*H01L 41/08* (2006.01)
*H01L 27/20* (2006.01)
*H01L 29/66* (2006.01)

(52) U.S. Cl.
CPC ........ *H01L 27/0285* (2013.01); *H01L 27/0727* (2013.01); *H01L 27/20* (2013.01); *H01L 29/66462* (2013.01); *H01L 29/7787* (2013.01); *H01L 29/8611* (2013.01); *H01L 41/08* (2013.01)

(58) Field of Classification Search
CPC ................................. H01L 29/66462
See application file for complete search history.

(56) References Cited

U.S. PATENT DOCUMENTS

| | | | | |
|---|---|---|---|---|
| 2009/0079491 A1* | 3/2009 | Kawamura | ........... | H03K 17/302 327/434 |
| 2010/0052176 A1* | 3/2010 | Kamada | .............. | H01L 23/4821 257/763 |
| 2011/0193619 A1* | 8/2011 | Parikh | ................. | H01L 21/8258 327/534 |
| 2011/0210377 A1* | 9/2011 | Haeberlen | ........... | H01L 29/2003 257/194 |
| 2012/0241820 A1* | 9/2012 | Briere | .................. | H03K 17/168 257/195 |
| 2012/0280278 A1* | 11/2012 | Curatola | ........... | H01L 29/42316 257/191 |
| 2014/0374765 A1* | 12/2014 | Curatola | ............. | H01L 29/7783 257/76 |

OTHER PUBLICATIONS

Curatola, et al., "Normally-Off High Electron Mobility Transistors", U.S. Appl. No. 13/100,343 filed on May 4, 2011.

* cited by examiner

*Primary Examiner* — Nicholas Tobergte
(74) *Attorney, Agent, or Firm* — Murphy, Bilak & Homiller, PLLC

(57) ABSTRACT

A high electron mobility transistor includes a buffer region and a barrier region adjoining and extending along the buffer region, the buffer and barrier regions are formed from semiconductor materials having different band-gaps and form an electrically conductive channel from a two-dimensional charge carrier gas. A gate structure is configured to control a conduction state of the channel and includes an electrically conductive gate electrode, a first doped semiconductor region, a second doped semiconductor region, and a resistor. The first doped semiconductor region is in direct electrical contact with a first section of the gate electrode. The second doped semiconductor region is in direct electrical contact with a second section of the gate electrode. The first and second doped semiconductor regions form a p-n junction with one another. The first and second sections of the gate electrode are electrically coupled to one another by the resistor.

20 Claims, 7 Drawing Sheets

HIGH ELECTRON MOBILITY TRANSISTOR WITH RC NETWORK INTEGRATED INTO GATE STRUCTURE

TECHNICAL FIELD

The instant application generally relates to high electron mobility transistors, and more particularly relates to gate structures for normally-off high electron mobility transistors.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN. In a GaN/AlGaN based HEMT, a two-dimensional electron gas (2DEG) arises at the interface between the AlGaN barrier layer and the GaN buffer layer. In an HEMT, the 2DEG forms the channel of the device instead of a doped region, which forms the channel in a conventional MOSFET device. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Measures must be taken to prevent the channel region of an HEMT from being in a conductive state in the absence of a positive gate voltage.

Due to the high electron mobility of the two-dimensional carrier gas in the heterojunction configuration, HEMTs offer high conduction and low losses in comparison to many conventional semiconductor transistor designs. These advantageous conduction characteristics make HEMTs desirable in applications, including, but not limited to use as switches in power supplies and power converters, electric cars, air-conditioners, and in consumer electronics, for example. However, normally-on HEMTs have limited applicability in these applications because these devices must be accompanied by circuitry that can generate the negative voltages necessary to turn the device off. Such circuitry adds cost and complexity to the design. For this reason, it is typically desirable to include features in an HEMT that modify the intrinsic normally-on configuration and provide a normally-off device.

One technique for providing an HEMT with a positive threshold voltage (i.e., a normally-off device) involves the incorporation of features into the gate structure that modify the intrinsic conductive state of the channel. For example, the gate structure may be modified, e.g., by doping the insulating portion so as to generate an electric field that influences the conduction band in the buffer layer and locally depletes the channel. The channel may be returned to a conductive state by the application of a positive voltage to the gate electrode. Consequently, the device has a positive threshold voltage. However, the introduction of dopants into the insulating portion of the device may determinately impact one or more device parameters, such as leakage current, maximum gate voltage and transconductance. Accordingly, there is a need to provide a normally-off HEMT without determinately impacting device parameters.

SUMMARY

A high electron mobility transistor is disclosed. According to an embodiment, the transistor includes a buffer region, and a barrier region adjoining and extending along the buffer region. The buffer and barrier regions are formed from semiconductor materials having different band-gaps such that an electrically conductive channel including a two-dimensional charge carrier gas arises at an interface between the buffer and barrier regions due to piezoelectric effects. The transistor further includes a gate structure being configured to control a conduction state of the channel, the gate structure including an electrically conductive gate electrode, a first doped semiconductor region, a second doped semiconductor region, and a resistor. The first doped semiconductor region is in direct electrical contact with a first section of the gate electrode. The second doped semiconductor region is in direct electrical contact with a second section of the gate electrode. The first and second doped semiconductor regions have opposite conductivity types and form a p-n junction with one another. The first and second sections of the gate electrode are electrically coupled to one another by the resistor.

According to another embodiment, the transistor includes a buffer region, and a barrier region adjoining and extending along the buffer region. The buffer and barrier regions are formed from semiconductor materials having different band-gaps such that an electrically conductive channel including a two-dimensional charge carrier gas arises at an interface between the buffer and barrier regions due to piezoelectric effects. The transistor further includes a gate structure being configured to control a conduction state of the channel and including an electrically conductive gate electrode and an RC network integrated into the gate structure. The RC network includes first and second capacitors and a resistor. The first and second capacitors are connected between the gate electrode and the channel in a series configuration. The resistor is connected in parallel with the first capacitor and in series with the second capacitor.

According to another embodiment, the transistor includes a buffer region, and a barrier region adjoining and extending along the buffer region. The buffer and barrier regions are formed from semiconductor materials having different band-gaps such that an electrically conductive channel including a two-dimensional charge carrier gas arises at an interface between the buffer and barrier regions due to piezoelectric effects. The transistor further includes source and drain electrodes being spaced apart from one another and in ohmic contact with the channel. The transistor further includes a gate structure being configured to control a conduction state of the channel, the gate structure including an electrically conductive gate electrode, a first diode, a second diode, and a resistor. The gate structure is configured such that the channel is in a conductive state at a positive gate-source potential and a non-conductive state at zero gate-source potential. The first diode is arranged to be forward biased at the positive gate-source potential. The second diode is arranged to be reverse biased at the positive gate-source potential. The only connection between the gate electrode and the first diode at a positive gate-source potential is through the resistor.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein include a high electron mobility transistor that is formed from a heterojunction substrate. The substrate includes buffer and barrier regions being formed from semiconductor materials (e.g., GaN and AlGaN) having different band-gaps such that an electrically conductive channel comprising a two-dimensional charge carrier gas arises at an interface between the buffer and barrier regions due to piezoelectric effects. The transistor includes a gate structure having a gate electrode and two opposite conductivity type doped semiconductor regions being arranged between the gate electrode and the barrier region. One of the doped regions is configured to locally deplete the two-dimensional charge carrier gas and provide a normally-off device.

Advantageously, the gate structure is configured with two diodes and a resistor, with the diodes and resistor being collectively arranged to suppress any potential leakage current between the gate electrode and the channel. One of the diodes is reversed biased at positive gate potential and therefore blocks any potential leakage current. The other one of the diodes is forward biased at positive gate potential, but this forward bias can only be applied by the resistor. The resistor may have a very large resistance value (e.g., between 500Ω and 10 kΩ) such that there is very little current flowing through the forward biased diode.

Further, the two diodes have intrinsic capacitance values that can be tailored to an optimum ratio such that the relatively high resistance value of the resistor does not detrimentally impact the switching speed of the device. This tailoring is achieved by appropriately selecting the doping concentrations of the doped semiconductor regions in the gate structure. Accordingly, the embodiments described herein provide an HEMT device with an RC network integrated into the gate structure, with the RC network providing transfer characteristics that are not present in conventional normally-off HEMT devices. Furthermore, this device can be efficiently manufactured at minimal added expense in comparison to conventional high HEMT devices, as the resistor and the diodes can be formed using doped semiconductor layers of III-Nitride semiconductor material (e.g., p-GaN and N-GaN). Further advantages will be apparent in the context of the following discussion of the figures.

Figure 1:
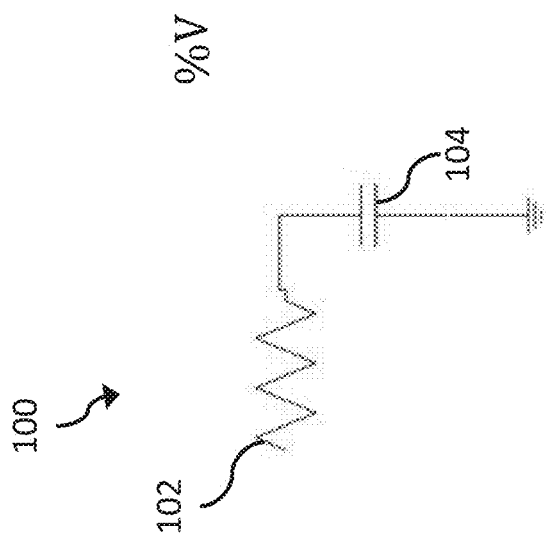
FIG. 1 illustrates an RC circuit equivalent of a transistor gate input, according to an embodiment.

FIG. 1 depicts an RC network 100. The RC network 100 is a first order network having a first resistor 102 connected in series with a first capacitor 104. This RC network 100 represents the inherent resistance and capacitance present in a MISFET structure, such as a normally-off HEMT device.

Figure 2:
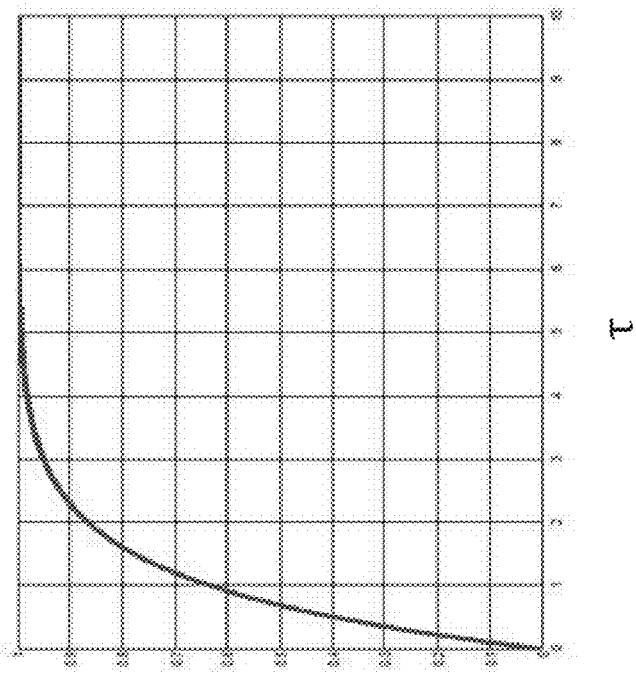
FIG. 2 illustrates a transfer characteristic of the RC circuit depicted in FIG. 1, according to an embodiment.

FIG. 2 depicts a transfer characteristic of the RC network 100 of FIG. 1, as represented by a dominant pole approximation. The dominant pole approximation approximates the time-voltage response of RC network 100 to a voltage step signal, i.e., a voltage transition from a low value to a high value that is intended to turn a device "ON." As can be seen, the voltage across the RC network 100 does not immediately transition from a low value to a high value in response to the step signal, and instead gradually transitions from a low value to a high value. This response is attributable to the time delay associated with the charging of the first capacitor 104. The first capacitor 104 requires a certain amount of time to reach a fully charged state and consequently apply the full bias of the step signal. This charging is defined by a time constant $\tau = R*C$, where R is a resistance of the first resistor 102 and C is a capacitance of the first capacitor 104. The transfer characteristic of FIG. 2 is described by the equation 1 provided below.

$$G(s) = \frac{1}{1 + \tau s} \qquad \text{Equation 1}$$

The y-axis in FIG. 2 represents the percentage voltage across the first capacitor 104 in relation to the full voltage of the step signal. The x-axis of FIG. 2 represents charging time of the RC network in increments of $\tau$. The first capacitor 104 is effectively fully charged (more particularly 99.3% charged) at a time approximately equal to $5\tau$. In many applications, it is desirable to reduce the time delay associated with the switching operation. Such an improvement allows for an increase in the frequency at which the transistor may be operated. As the dominant pole time constant $\tau$ is simply dependent upon the resistance of the first resistor 102 and the capacitance of the first capacitor 104, there are two potential parameters that can be modified to reduce the time delay associated with the switching operation, namely the capacitance and resistance of the RC network 100. For example, the time constant $\tau$ can be lowered by a reducing the capacitance of the first capacitor 104. However, in a MISFET structure, this modification is typically achieved by thinning the gate insulator and/or reducing the dielectric constant of the gate insulator, which consequently increases the leakage current of the device. Conversely, one can reduce the leakage current a MISFET structure by intentionally adding resistance into the gate so as to increase the resistance of the first resistor 102. However, this modification leads to increased switching delays, because the time constant $\tau$ is proportional to the resistance of the first resistor 102. In other words, a tradeoff between leakage current and gate capacitance is typically unavoidable when seeking to optimize the switching characteristics of a MISFET device.

Figures 3, 4:
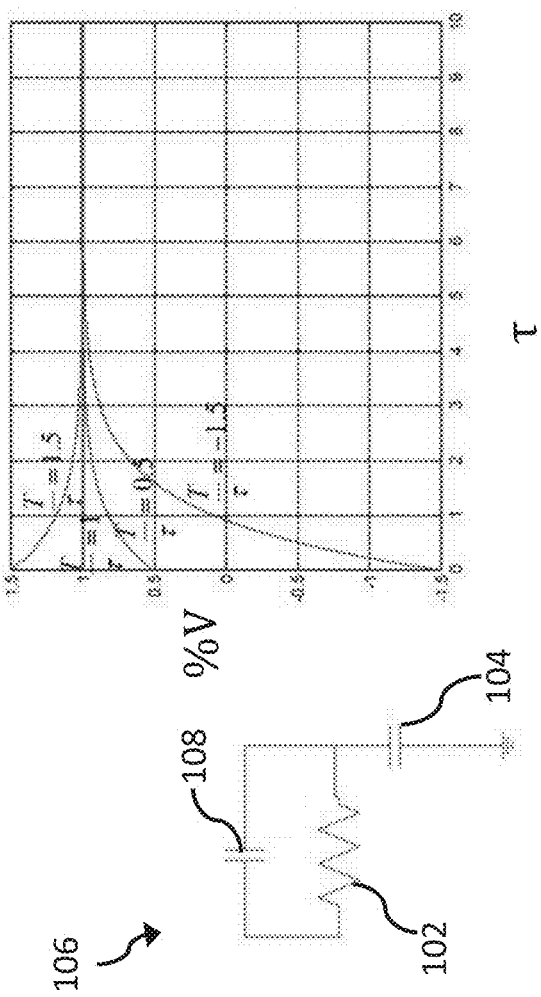
FIG. 3 illustrates an RC circuit equivalent of a transistor gate input that includes a capacitor in parallel with the input resistance, according to an embodiment.
FIG. 4 illustrates a transfer characteristic of the RC circuit depicted in FIG. 3, according to an embodiment.

FIG. 3 depicts an RC network 106 (or more particularly, a CRC circuit) that differs from the RC network 100 of FIG. 1 in that a second capacitor 108 is connected in parallel with the first resistor 102 and in series with the second capacitor 108.

The incorporation of the second capacitor 108 introduces a zero into the system, which means that the transfer characteristic is not completely dependent upon by the dominant pole time constant τ and instead is also dependent upon a zero time constant T. In this circuit, the dominant pole time constant τ is calculated as τ=R (C$_1$+C$_2$), where R is a resistance of the first resistor 102, C$_1$ is a capacitance of the first capacitor 104 and C$_2$ is a capacitance of the second capacitor 108. Further, in this circuit, the zero time constant T is calculated as T=RC$_2$, where R is a resistance of the first resistor 102 and C$_2$ is a capacitance of the second capacitor 108.

FIG. 4 depicts a transfer characteristic of the RC network 106 of FIG. 3 as approximated by the dominant pole time constant τ and the zero time constant T. The transfer characteristic G(s) of FIG. 4 is described by the equation 2 provided below.

$$G(s) = \frac{1 + Ts}{1 + \tau s} \quad \text{Equation 2}$$

The y-axis of FIG. 4 represents the percentage voltage across the first capacitor 104 in relation to the full voltage of the step signal. The x-axis of FIG. 4 represents charging time of the RC network 106 in increments of T. As can be seen, the introduction of a second capacitor 108 that is parallel to the first capacitor 104 into the circuit has a compensatory effect that can be utilized to reduce the switching delay associated with the charging of the first capacitor 104. The response time of the RC network 106 of FIG. 3 is dependent upon a ratio between the dominant pole time constant τ and the zero time constant T. Particularly for ratio values of between 1.5 and 0.5, the response time of the RC network 106 of FIG. 3 is significantly reduced in comparison to the response time of the RC network 100 of FIG. 1.

The inclusion of a zero into the system allows for the resistance of the first resistor 102 to be made very high without compromising the response time of the RC network 106. Therefore, in the context of a MISFET structure, this principle can be utilized to intentionally increase the input resistance of the device so as to constrain the amount of leakage current flowing into the gate. Meanwhile, the switching time of the device can be maintained or even improved by appropriately tailoring the capacitance values of the first and second capacitors 104, 108 and consequently achieving an optimal ratio between the dominant pole time constant τ and the zero time constant T. Exemplary device structures that utilize this concept will now be discussed.

Figure 5:
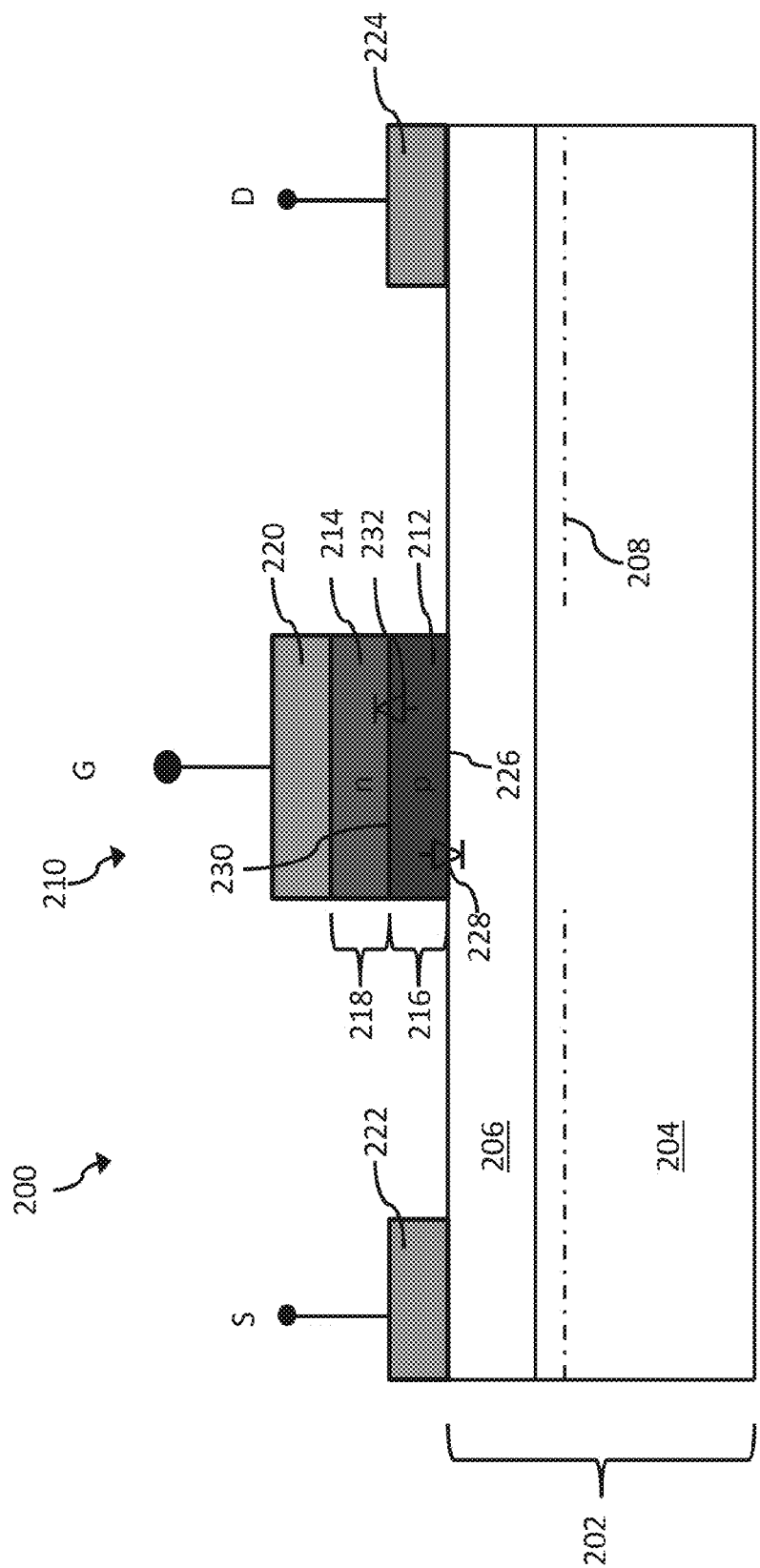
FIG. 5 illustrates a high electron mobility transistor having two opposite polarity diodes integrated into the gate structure, according to an embodiment.

Referring to FIG. 5, a high electron mobility transistor 200 is depicted. The transistor is formed from a substrate 202 having a buffer region 204 and a barrier region 206 adjoining and extending along the buffer region 204. The buffer and barrier regions 204, 206 are formed from semiconductor materials having different band-gaps such that an electrically conductive channel 208 comprising a two-dimensional charge carrier gas arises at an interface between the buffer and barrier regions 204, 206 due to piezoelectric effects. That is, the substrate 202 is includes a heterojunction.

According to an embodiment, the buffer region 204 is formed from a layer of intrinsic GaN (gallium nitride) and the barrier region 206 is formed from a doped layer of GaN, such as InGaN (indium gallium nitride) or AlGaN (aluminum gallium nitride). Specifically with regard to GaN technology, the presence of polarization charges and strain effects in a GaN-based heterostructure body due to spontaneous and piezoelectric polarization yield a two-dimensional charge carrier gas in the heterostructure body characterized by very high carrier density and carrier mobility. This two-dimensional charge carrier gas, such as a 2DEG or 2DHG, forms the conductive channel 208 of the device near the interface between, e.g., a GaN alloy barrier layer such as AlGaN or InAlGaN and a GaN buffer layer. A thin, e.g., 1-2 nm, AlN layer can be provided between the GaN buffer layer and the GaN alloy barrier layer to minimize alloy scattering and enhance 2DEG mobility. In a broad sense, the compound semiconductor transistor described herein can be formed from any binary, ternary or quaternary III-nitride compound semiconductor material where piezoelectric effects are responsible for the device concept. In general, the compound semiconductor transistor can be realized using any suitable III-nitride technology such as GaN that permits the formation of opposite polarity inversion regions due to piezoelectric effects.

The transistor 200 includes a gate structure 210 that controls the conduction (or non-conduction) state of the two-dimensional charge carrier gas channel 208. The gate structure 210 includes a first doped semiconductor region 212 and a second doped semiconductor region 214. The first doped semiconductor region 212 has a first conductivity type (e.g., p-type) and the second semiconductor region has a second conductivity type (e.g., n-type). According to an embodiment, the first doped semiconductor region 212 includes a first doped layer 216 of semiconductor material that is formed on the barrier region 206. The first doped layer 216 may directly adjoin the barrier region 206. The second doped semiconductor region 214 includes a second doped layer 218 that is formed on the first doped semiconductor region 212 and may directly adjoin the first doped semiconductor region 212. According to an embodiment, the first and second doped layers 216, 218 are formed from the same semiconductor material as the substrate 202. For example, in the case of substrate 202 that is a GaN/AlGaN heterostructure, the first doped semiconductor region 212 may be formed from a layer of p-type GaN that is formed on the barrier region 206 and the second doped semiconductor region 214 may be formed from a second layer of n-type GaN that is formed on the layer of p-type GaN. According to another embodiment, the first and second doped layers 216, 218 are formed from p-type AlGaN and n-type AlGaN. respectively. The first and second doped layers 216, 218 may be formed using epitaxial techniques, for example.

The gate structure 210 further includes an electrically conductive gate electrode 220. The gate electrode 220 may be formed from any electrically conductive material, such as a conductive metal. Examples of suitable materials for the gate electrode include Al, TiN, TaN, Ti, Ta, Ti/Al and Ti/Al/Ti. Alternatively, the gate electrode 220 may be formed from a conductive semiconductor material (e.g., polysilicon).

The transistor 200 includes electrically conductive source and drain electrodes 222, 224 that are spaced apart from one another and are in ohmic contact with the channel 208. In the absence of a mechanism to modify the intrinsic conductive state of the channel 208, the two dimensional charge carrier gas would form a complete conductive connection between the source and drain electrodes 222, 224 at zero gate bias. According to an embodiment, the doping concentration of the first doped semiconductor region 212 has been fixed to a minimum value so as to change the intrinsic conductive state of the channel 208 by generating a vertical electric field that influences the conduction band in the barrier region 206 and effectively depletes the two-dimensional charge carrier gas (i.e., the channel 208 of the device). This depletion occurs in a region that is directly below the gate structure 210. For example, in the event that the first doped semiconductor region 212 is a region of p-type GaN, the p-type concentration in the first doped semiconductor region 212 is sufficiently high such that the channel 208 is in a conductive state at a positive gate-source potential and a non-conductive state at zero gate-source potential.

The transistor 200 can be switched between ON/OFF states by applying a bias to the first doped semiconductor region 212. By appropriately biasing the first doped semiconductor region 212, the vertical electric field that effectively depletes the two-dimensional charge carrier gas can be enhanced or removed. The first doped semiconductor region 212 can be set to the gate potential by forming a direct electrical connection between the first doped semiconductor region 212 and the gate electrode 220. One drawback of directly connecting gate electrode 220 to the first doped semiconductor region 212 in this manner is that it introduces a potential leakage path between the gate electrode 220 and the channel 208. The first doped semiconductor region 212 forms a first p-n junction 226 with the barrier region 206. This first p-n junction 226 provides a first diode 228 between the gate electrode 220 and the channel 208. If the first diode 228 is forward biased (e.g., in the case of a positive gate-source potential) by a potential that exceeds the threshold voltage of the first diode 228 (e.g., 3V), there is a conductive connection between the gate electrode 220 and the channel 208. Therefore, the existence of the first diode 228 in the device has the potential to detrimentally impact the power dissipation and/or maximum gate drive voltage of the device.

Advantageously, the device of FIG. 5 includes a second doped semiconductor region 214 integrated into the gate structure 210 that forms a second p-n junction 230. This second p-n junction 230 forms a second diode 232 that is arranged to block the potential leakage path described above. The first and second diodes 228, 232 are in series with one another, but have opposite polarity so as to block current flowing in either direction. For example, at a positive gate-source potential (i.e., a positive bias between the gate terminal 220 and the source electrode 222) the first diode 228 is forward biased and the second diode 232 is reverse biased. Thus, while a positive gate-source potential that exceeds the threshold voltage of the first diode 228 could place the first diode 228 in a conductive state, the second diode 232 will be in a blocking state under these conditions and will therefore prohibit leakage current from flowing between the gate electrode 220 and the channel 208.

The gate structure 210 in the device of FIG. 5 has no direct electrical connection between the gate electrode 220 and the first doped semiconductor region 212. Consequently, the first doped semiconductor region 212 may be electrically floating. That is, the potential of the first doped semiconductor region 212 may deviate from the gate potential. This configuration may be problematic because the gate structure 210 does not control the conduction state of the channel 208 under every bias condition. However, as previously explained, directly connecting the gate electrode 220 to the first doped semiconductor region 212 suffers from the drawback that it creates a potential leakage path through the first diode 228.

Figure 6:
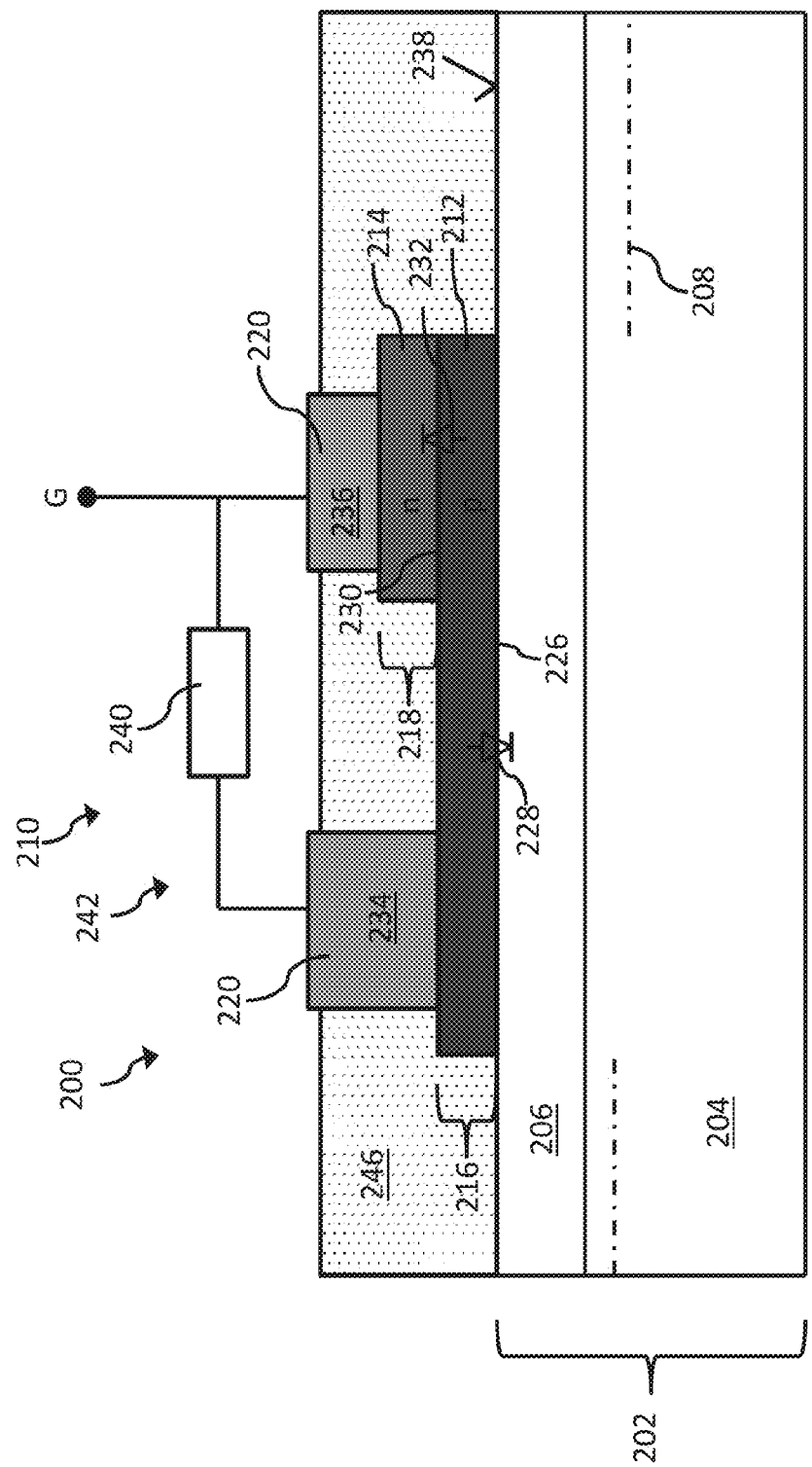
FIG. 6 illustrates a high electron mobility transistor with an RC network integrated into the gate structure that is configured to suppress leakage current and improve switching speed, according to an embodiment.

Referring to FIG. 6, a high electron mobility transistor 200 having a gate structure 210 that eliminates the floating gate condition described above while incorporating the benefits of the opposite polarity first and second diodes 228, 232 is depicted. The view of FIG. 6 has been enlarged to highlight the gate structure 210. The device may nonetheless include the source and drain electrodes 222, 224 previously described and be similarly or identically configured as the transistor 200 discussed with reference to FIG. 5, with the exception of the configuration of the gate structure 210, which will be described in further detail below.

The gate electrode 220 of the device in FIG. 6 has two discrete sections. A first section 234 of the gate electrode 220, which is shown on the left side of FIG. 6, is in direct electrical contact with the first doped semiconductor region 212. A second section 236 of the gate electrode 220, which is shown on the right side of FIG. 6, is in direct electrical contact with the second doped semiconductor region 214. This configuration electrically couples the gate electrode 220 with the channel 208 region of the substrate 202 through two paths. One coupling is between the first section 234 of the gate electrode 220 and the channel 208. This coupling only includes the first diode 228 (and not the second diode 232), which is in a forward biased state at positive gate-source potential. Therefore, absent a mechanism to mitigate the flow of current, this coupling represents a possible leakage path for carriers (e.g., holes and electrons) to flow into the channel 208. The other coupling is between the second section 236 of the gate electrode 220 and the channel 208. This coupling includes both the first and second diodes 228, 232. Because the second diode 232 is in a blocking state at positive gate-source potential, the coupling that includes both the first and second diodes 228, 232 is not a possible leakage path.

According to an embodiment, the first doped semiconductor region 212 directly adjoins and covers the barrier region 206 and the second doped semiconductor region 214 directly adjoins and covers the first doped semiconductor region 212. The first and second doped semiconductor regions 212, 214 may however have different areas. This area is measured in two directions (length and width directions) parallel to a first main surface 238 of the barrier region 206. An area of the second doped semiconductor region 214 is smaller than an area of the first doped semiconductor region 212 such that the second doped semiconductor region 214 only partially covers the first doped semiconductor region 212. Thus, there is a portion of the first doped semiconductor region 212 that is exposed from the second doped semiconductor region 214 and is accessible for electrical connection. The direct electrical connection between the first section 234 of the gate electrode 220 and the first doped semiconductor region 212 is provided at this uncovered portion of the first doped semiconductor region 212. That is, the first section 234 of the gate electrode 220 is in direct electrical contact with the uncovered portion of first doped semiconductor region 212. The second section 236 of the gate electrode 220 is in direct electrical contact with the second doped semiconductor region 214.

The direct electrical connection between the gate electrode 220 and the subjacent doped regions (either the first doped semiconductor region 212 or the second doped region) may be effectuated by any conductive structure, such as a metal or a highly doped semiconductor region. For example, according to an embodiment, the first section 234 of the gate electrode 220 is in direct electrical contact with the first doped semiconductor region 212 by a conductive via structure that extends through a passivation layer 246. Alternatively, the direct electrical connection between the gate electrode 220 and the subjacent doped regions may be effectuated by direct physical contact. For example, according to an embodiment, the first section 234 of the gate electrode 220 directly adjoins the first doped semiconductor region 212 so as to form a low-ohmic connection between the two.

The gate structure 210 in the device of FIG. 6 further includes an integrated resistor 240 that substantially abrogates any potential leakage current flowing through the first diode 228. According to an embodiment, the integrated resistor 240 electrically connects the first and second sections 234 of the gate electrode 220 together. Further, the transistor 200 may be configured such that the only conductive path to apply a positive gate-source potential to the first diode 228 is through the integrated resistor 240. Consequently, the first doped semiconductor region 212 can be maintained at a fixed gate potential by the integrated resistor 240. That is, the first doped semiconductor region 212 is not electrically floating, as it is coupled to the gate potential by the integrated resistor 240. The integrated resistor 240 is a discrete and intentionally formed part of the gate structure 210. The integrated resistor 240 adds resistance to the connection between the first doped semiconductor region 212 and the gate terminal (G) beyond what would be realized by a direct electrical connection (e.g., by a continuous conductive wire connection). The integrated resistor 240 may be formed on the substrate 202 in a different cross-sectional region than what is depicted in FIG. 6.

The device of FIG. 6 includes an RC network 242 that corresponds to the RC network 106 described with reference to FIG. 3. This RC network 242 is integrated into the gate structure 210. More particularly, the integrated resistor 240 corresponds to the first resistor 102 in the circuit of FIG. 3. The first p-n junction 226 provides the first capacitor 104 in the circuit of FIG. 3. This is attributable to the fact that there is a capacitance associated with any p-n junction, due to the depletion and diffusion of charges at the junction. Likewise, the second p-n junction 230 provides the second capacitor 108 in circuit of FIG. 3.

The RC network 242 is configured such that the first and second capacitors 104, 108 are connected between the gate electrode 220 and the channel 208 in a series configuration. That is, the first and second capacitors 104, 108 are arranged so that a gate-source voltage is distrusted across the first and second capacitors 104, 108, with one node that connects the first and second capacitors 104, 108 being at a potential that is between the gate potential and the source potential. In one exemplary embodiment of a series configuration, the first capacitor 104 is in direct electrical contact with the gate electrode 220 and a first node, and the second capacitor 108 is in direct electrical contact with the first node and the barrier region 206.

The RC network 242 is further configured such that the first resistor 102 (which is provided by the integrated resistor 240) is connected in parallel with the first capacitor 104 and in series with the second capacitor 108. That is, the integrated resistor 240 is arranged to be at the same voltage as the first capacitor 104. According to one exemplary embodiment of a parallel configuration, the first resistor 102 is in direct electrical contact with the with the gate electrode 220 and with the first node that connects the first and second capacitors 104, 108 together.

The gate structure 210 of FIG. 6 can also be described with reference to the connectivity and conductive states of the first and second diodes 228, 232 and the integrated resistor 240. According to an embodiment, the gate structure 210 is configured such that the first diode 228 is forward biased at a positive gate-source potential and such that the second diode 232 is reverse biased at the positive gate-source potential. This is because that the first and second p-n junctions 226, 230 are interposed between the gate electrode 220 and the channel 208. Therefore, when the first p-n junction 226 is in a conductive state, the second p-n junction 230 is in a blocking state (and vice-versa).

According to an embodiment, the only connection between the gate terminal (g) and the first diode 228 at a positive gate-source potential is through the integrated resistor 240. As previously explained, the second p-n junction 230 is in a blocking state at a positive gate-source potential and therefore does not provide a conductive connection between the gate terminal (G) and the first doped semiconductor region 212. The first doped semiconductor region 212 may nonetheless be set to the gate potential if one terminal of the integrated resistor 240 is directly electrically connected to the first section 234 of the gate electrode 220 and an opposite terminal of the integrated resistor 240 is directly electrically connected to the gate terminal (G). The connection between the integrated resistor 240 and the gate terminal (G) may be effectuated via the second section 236 of the gate electrode 220 or by a separate connection.

Advantageously, the principles explained with reference to FIG. 3 can be applied to the RC network 242 of FIG. 6 to reduce leakage current by setting a resistance of the integrated resistor 240 to a high value. According to one embodiment, the integrated resistor 240 has a resistance of between 500Ω and 10 KΩ. More particularly, the integrated resistor 240 may have a resistance of 1000Ω. At this value, with a positive gate-source potential of 5 volts, the amount of leakage current flowing into the first diode 228 will not exceed 5 mA (milliamps). Further, a detrimental impact on switching time of the transistor 200 due to the high resistance value of the integrated resistor 240 may be avoided by adjusting the ratio of capacitance values between the first and second capacitors 104, 108 and therefore tailoring the ratio between the dominant pole time constant τ and the zero time constant T as described with reference to FIG. 3. According to one embodiment, a ratio between a dominant pole time constant τ constant of the RC network 242 and a zero time constant T of the RC network 242 is between 1.5 and 0.5. As the capacitance of the first and second p-n junctions 226, 230 is dependent upon the doping concentrations of the first and second doped semiconductor regions 212, 214, these doping concentrations can be easily tailored to achieve preferable ratios between a dominant pole time constant τ of the RC network 242 and a zero time constant T of the RC network 242. This ratio can be controlled with a high degree of precision so as to avoid a voltage overshoot condition, e.g., in the case of ratio values greater than 1.5.

The first and seconds capacitors 104, 108 may have a capacitance in the range of 200 pF (picoFarads) to 5 nF (nanoFarads), for example, in a transistor with 70 mΩ $R_{DS}ON$ (on-state drain-source resistance). For different $R_{DS}ON$ values, the capacitances of the first and seconds capacitors 104, 108 can be tailored accordingly.

Figure 7:
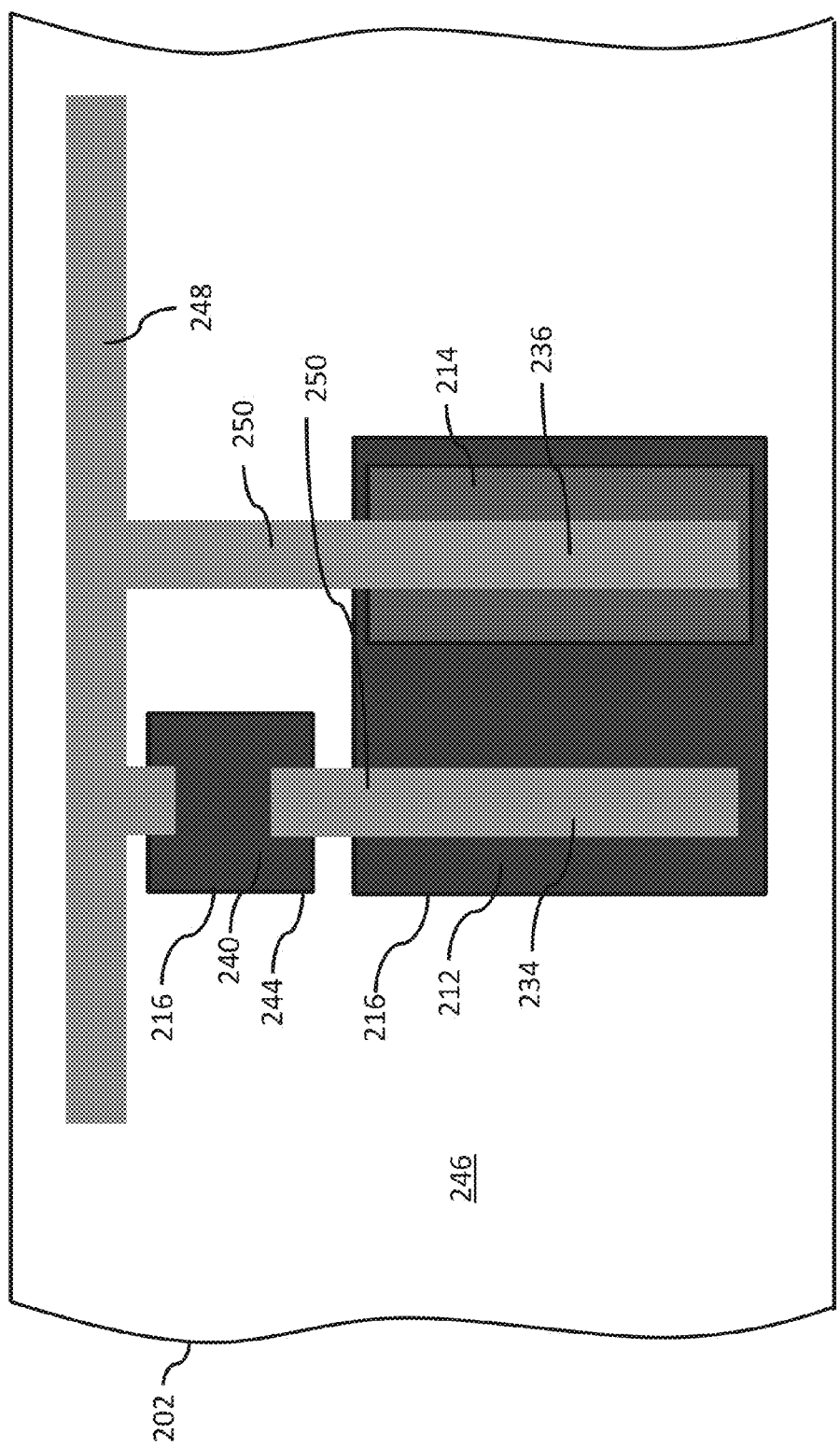
FIG. 7 illustrates a plan-view of the high electron mobility transistor of FIG. 6, according to an embodiment.

Referring to FIG. 7, a plan-view of the transistor 200 is depicted, according to an embodiment. In this embodiment, the first doped layer 216 forms both the first doped semiconductor region 212 and the resistor 240. The resistor 240 is formed by a section 244 of the first doped layer 216 that is discrete from and physically separated from the first doped semiconductor region 212. The geometry of the first doped semiconductor region 212 and the resistor section 244 may be provided by masked etching techniques, for example. The first doped semiconductor region 212 and the resistor section 244 may be physically separated by an insulative passivation layer 246, which is formed on the barrier region 206 and is laterally adjacent to the first doped layer 216 and the second doped layer 218. The passivation layer 246 may be formed from any of a variety of dielectrically insulating materials, such as SiN or $SiO_2$.

According to an embodiment, the resistor section 244 has a rectangular shape. As those of ordinary skill will appreciate, the resistance of a structure is determined by the geometry of the structure (e.g., the cross sectional area or two-dimensional area, in the case of a sheet resistance) and the conductivity of the material. In the case of a semiconductor material, conductivity can be influenced by adjustment to the doping concentration of the material. Thus, by forming the resistor 240 from rectangular sections 244 of the first doped layer 216, which is a semiconductor layer, the resistance value of the resistor 240 can be controlled to a high degree of precision. The geometry and doping concentration of the resistor sections 244 section can be easily defined and controlled, e.g., by the parameters of the epitaxial processes used to form the first doped layer 216 and the subsequent etching process that is applied to the first doped layer 216.

In one exemplary embodiment, each of the rectangular resistor sections 244 has a sheet resistance of approximately 100 kΩ per square. These rectangular resistor sections 244 can be strung together in a parallel configuration to achieve a desired overall gate input resistance of the integrated resistor 240. For example, the integrated resistor 240 can be formed from 100 of the 100 kΩ rectangular resistor sections 244 connected in parallel with one another such that an overall resistance of the integrated resistor 240 is approximately 1 kΩ. More generally, each of the rectangular resistor sections 244 can have a sheet resistance of approximately between 50 kΩ and 150 kΩ per square, and a sufficient number of the rectangular resistor sections 244 can be connected in parallel such that an overall resistance of the integrated resistor 240 is between 500Ω and 10 kΩ. These values are provided as examples, and the same principles may be applied using rectangular resistor sections 244 sections of different shape and/or resistance to form the integrated resistor 240.

The device of FIG. 7 is configured with a main gate bus line 248 and a plurality of gate fingers 250. The first and second sections 234, 236 of the gate electrode 220 are provided by alternating ones of the gate fingers 250. That is, for each pair of gate fingers 250 that extends over one of the first doped semiconductor regions 212, one of the gate fingers 250 provides the first section 234 of the gate electrode 220 and the other one of the gate fingers 250 provides the second section 236 of the gate electrode 220. FIG. 7 shows one unit cell having this configuration. This unit cell may be repeated a number of times to form a single one of the transistors 200. The main gate bus line 248 provides a global connection between the gate terminal (G) and the first and second sections 234, 236 of the gate electrode 220. According to an embodiment, the main gate bus line 248 and the gate fingers 250 are formed from a metallization layer, such as a copper, aluminum or gold metallization.

Advantageously, the configuration depicted in FIG. 7 provides a space efficient layout for the transistor 200 in which the resistor sections 244 minimally increase the overall area requirement of the gate structure 210 in comparison to a gate structure 210 that does not include the integrated resistor 240. The presence of integrated resistor 240 in the gate structure 210 may require no more than 10% of additional layout area in comparison to a gate structure 210 that does not include the integrated resistor 240. From the plan-view perspective of FIG. 7, each of the gate fingers 250 are perpendicular to the main gate bus line 248 and each of the resistor sections 244 in the plurality are arranged between the first doped semiconductor region 212 and the main gate bus line 248. Further, the lateral width of the resistor sections 244 can be the same or less than a lateral width of the first doped semiconductor region 212. Thus, the lateral width of each unit cell is not increased by the inclusion of the resistor sections 244 in the gate structure 210. In other words, the incorporation of the resistor sections 244 into the gate structure 210 may only require expansion of the unit cell in one direction (i.e., the vertical direction, from the perspective of FIG. 7). Further, the geometry of the resistor sections 244 depicted in FIG. 7 can be easily formed according to known techniques. Therefore, the incorporation of the integrated resistor 240 into the gate structure 210 can be done at minimal cost and complexity.

Figure 8:
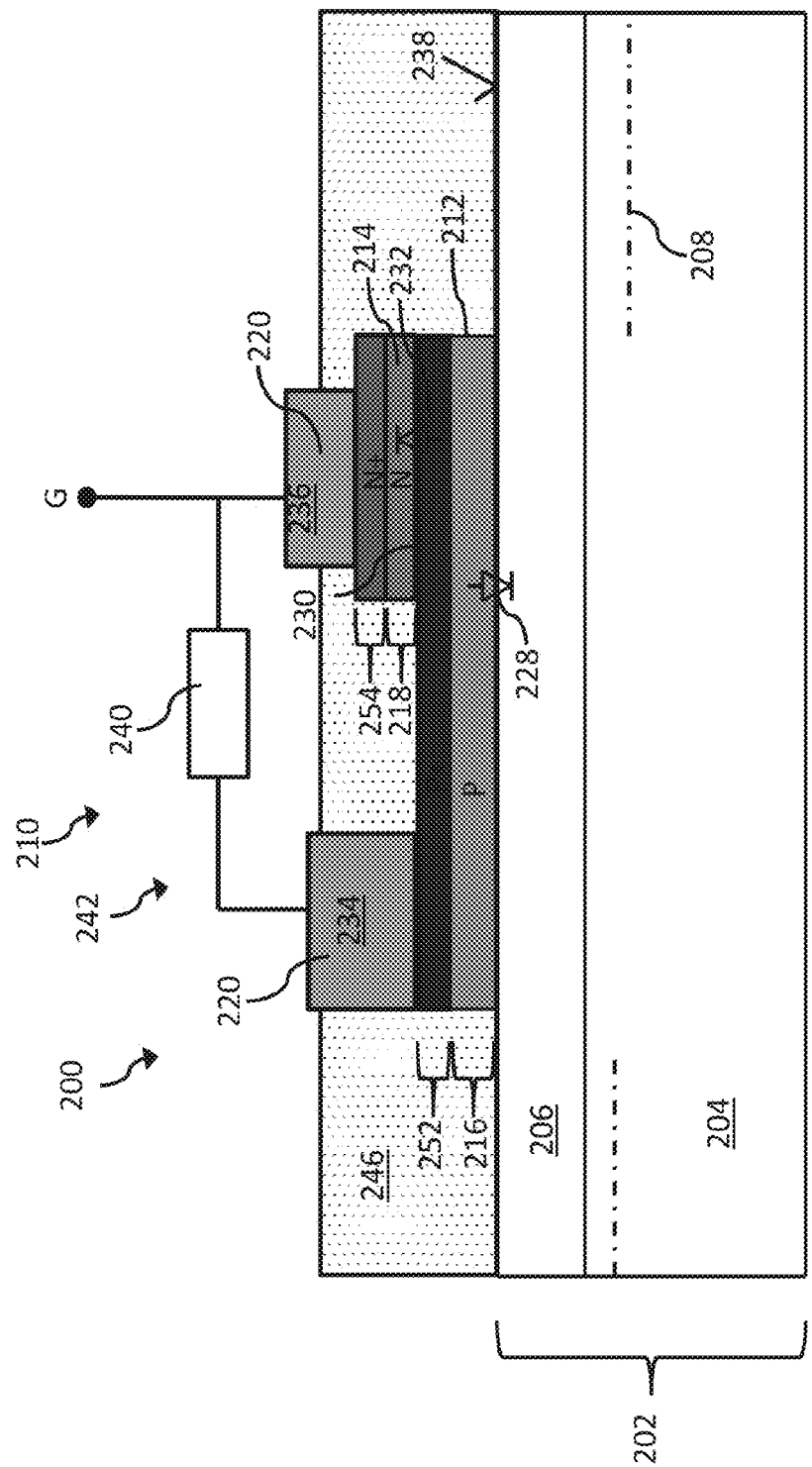
FIG. 8 illustrates a high electron mobility transistor with an RC network integrated into the gate structure that is configured to suppress leakage current and maintain switching speed, according to another embodiment.

Referring to FIG. 8, a close up view of a gate structure 210 according to another embodiment is depicted. The transistor 200 of FIG. 8 differs from the previous embodiments discussed in that the first and second doped semiconductor regions 212, 214 are each formed from two semiconductor layers. In addition to the first doped layer 216, the first doped semiconductor region 212 further includes a third doped layer 252 of semiconductor material being more highly doped than the first doped layer 216. The third doped layer 252 is formed on the first doped layer 216 and is in direct electrical contact with the first section 234 of the gate electrode 220. The second doped semiconductor region 214 further includes a fourth doped layer 254 of semiconductor material being more highly doped than the second doped layer 218. The fourth doped layer 254 is formed on the second doped layer 218 and is in direct electrical contact with the second section 236 of the gate electrode 220

Advantageously, the multi-layer gate structure 210 configuration of FIG. 8 allows for optimization of the electrical parameters of the RC network 242 as well as the contact resistance between the gate electrode 220 and the first and second doped semiconductor regions 212, 214. For example, a junction capacitance of the second p-n junction 230 can be controlled to achieve a desired value for the second capacitor 108 (e.g., 1 nF by adjustment to the doping concentration of the second semiconductor layer 218. Further, this doping concentration may be independent from a doping concentration of the region that connects the second doped semiconductor region 214 to the second section 236 of the gate electrode 220. Likewise, the junction capacitance of the first p-n junction 226 is independent from the contact resistance between the first section 234 of the gate electrode 220 and the first doped semiconductor region 212, as these two parameters are dependent upon the doping concentration of the first and third doped layers 216, 252, respectively.

Similar principles may be utilized to provide a multi-layer gate structure 210 with three or more doped layers that form each of the first and second doped semiconductor regions 212, 214. In this way, further tailoring of the doping profile and associated capacitances can be achieved. Likewise, these principles may be used to provide a gate structure 210 with one doped layer for the first and second doped semiconductor regions 212, 214, with these doped layers having locally varying doping concentration (e.g., from tailoring the dopant dosages and annealing times).

Figure 9:
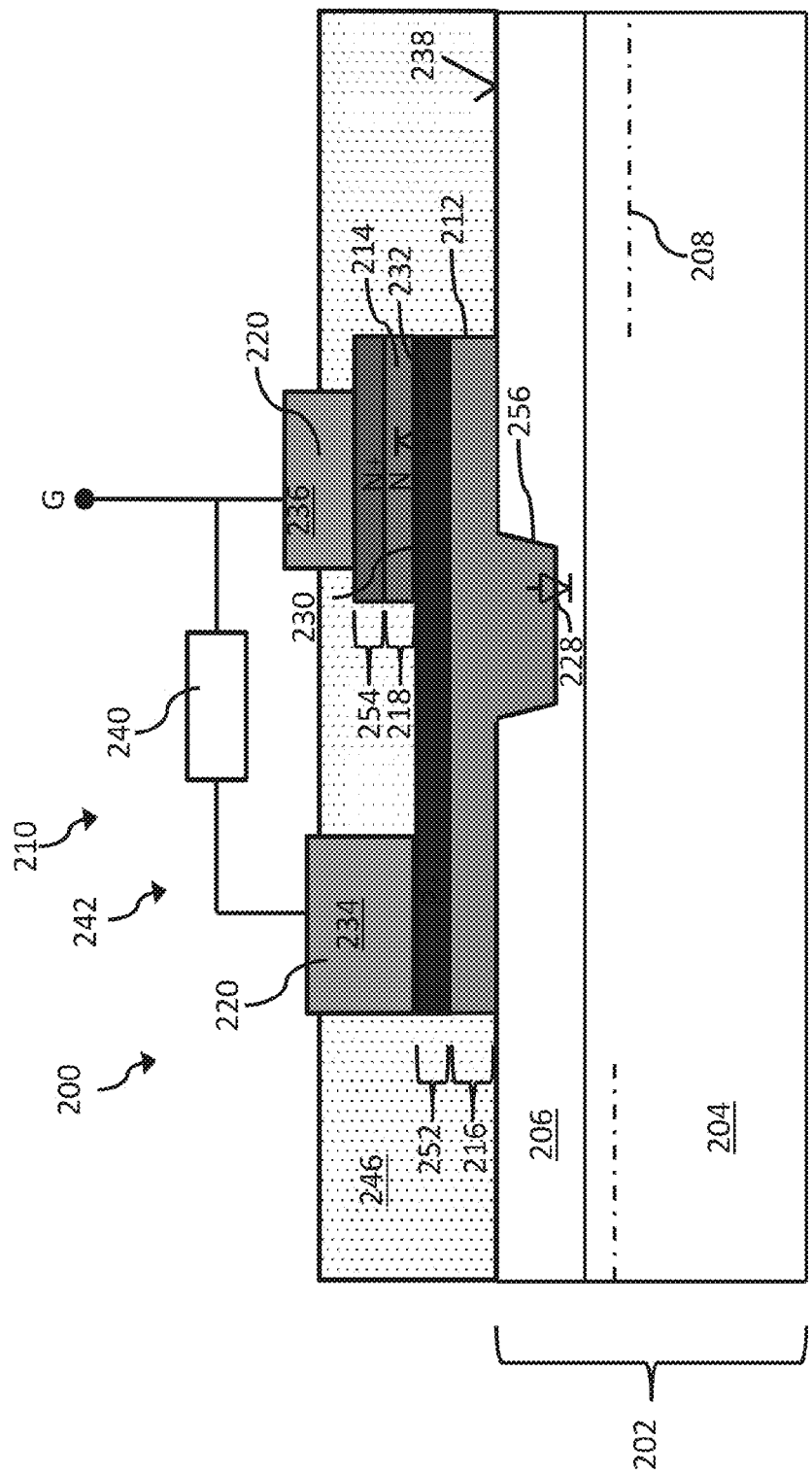
FIG. 9 illustrates a high electron mobility transistor with an RC network integrated into the gate structure that is configured to suppress leakage current and maintain switching speed, according to another embodiment.

Referring to FIG. 9, a close up view of a gate structure 210 according to another embodiment is depicted. The transistor 200 of FIG. 9 differs from the previous embodiments discussed in that a recess 256 has been formed in the barrier region 206. The recess 256 extends away from the first main surface 238 of the barrier region 206. That is, the recess 256 extends into the substrate 202 so as to provide a surface of the substrate 202 that is spaced closer to the two-dimensional charge carrier gas than the first main surface 238. The recess may be formed, e.g., by etching techniques. The gate structure 210 is configured with the first doped semiconductor region 212 being formed in the recess 256. Such a configuration may be desirable to achieve further or better depletion of the two-dimensional charge carrier gas underneath the gate structure 210 and consequently achieve more stable control of the channel 208.

The term "directly electrically connected" or "in direct electrical contact" describes a permanent low-ohmic connection between electrically connected elements, for example a direct contact between the concerned elements or a low-ohmic connection via a metal and/or highly doped semiconductor. By contrast, the term "electrically coupled" means that one or more intervening element(s) configured to influence the electrical signal in some tangible way is be provided between the electrically coupled elements. These intervening elements include active elements, such as transistors, as well as passive elements, such as inductors, capacitors, diodes, resistors, etc.

As used herein, the term "gate structure" refers to the electrically conductive gate electrode that receives the switching signal from the gate terminal and the subjacent portions of semiconductor material that insulate the gate electrode from the channel and separate the gate electrode from the substrate.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A high electron mobility transistor, comprising:
a buffer region;
a barrier region adjoining and extending along the buffer region, the buffer and barrier regions being formed from semiconductor materials having different band-gaps such that an electrically conductive channel comprising a two-dimensional charge carrier gas arises at an interface between the buffer and barrier regions due to piezoelectric effects; and
a gate structure being configured to control a conduction state of the channel, the gate structure comprising an electrically conductive gate electrode, a first doped semiconductor region, a second doped semiconductor region, and a resistor,
wherein the first doped semiconductor region is in direct electrical contact with a first section of the gate electrode;
wherein the second doped semiconductor region is in direct electrical contact with a second section of the gate electrode,
wherein the first and second doped semiconductor regions have opposite conductivity types and form a p-n junction with one another, and
wherein the first and second sections of the gate electrode are electrically coupled to one another by the resistor.

2. The transistor of claim 1, wherein the first doped semiconductor region comprises a first doped layer of semiconductor material being formed on the barrier region, wherein the second doped semiconductor region comprises a second doped layer of semiconductor material being formed on the first doped semiconductor region, and wherein the resistor is formed by a section of the first doped layer that is physically isolated from the first doped semiconductor region.

3. The transistor of claim 2, wherein the buffer region comprises Gallium Nitride, wherein the barrier region comprises Aluminum Gallium Nitride, wherein the first doped layer of semiconductor material is a layer of p-type Gallium Nitride or Aluminum Gallium Nitride, and wherein the second doped layer of semiconductor material is a layer of n-type Gallium Nitride or Aluminum Gallium Nitride.

4. The transistor of claim 3, wherein the first doped semiconductor region directly adjoins and covers the barrier region, wherein the second doped semiconductor region directly adjoins and covers the first doped semiconductor region, wherein an area of the second semiconductor region is smaller than an area of the first doped semiconductor region such that the second doped semiconductor region only partially covers the first doped semiconductor region, wherein the first section of the gate electrode is in direct electrical contact with an uncovered portion of the first semiconductor region.

5. The transistor of claim 4, wherein the resistor is formed by a plurality of rectangular sections of the first doped layer, and wherein each of the rectangular sections in the plurality are electrically connected with the first and second sections of the gate electrode, and wherein each of the rectangular sections are electrically insulated from the first doped semiconductor region by a passivation layer that is formed on the barrier region.

6. The transistor of claim 5, further comprising a main gate bus line and a plurality of gate fingers, the main gate bus line and gate fingers being formed from a metallization layer, wherein the first and second sections of the gate electrode are formed from alternating ones of the gate fingers, and wherein, from a plan view perspective transistor, each of the gate fingers is perpendicular to the main gate bus line and each of the rectangular sections in the plurality is arranged between the first doped semiconductor region and the main gate bus line.

7. The transistor of claim 6, wherein each of the rectangular sections in the plurality is connected in parallel with one another and has a resistance of between 50 kΩ and 150 kΩ, and wherein the resistor has a resistance of between 500Ω and 10 kΩ.

8. The transistor of claim 2, wherein the first doped semiconductor region further comprises a third doped layer of semiconductor material being more highly doped than the first doped layer, wherein the third doped layer is formed on the first doped layer and is in direct electrical contact with the first section of the gate electrode, wherein the second doped semiconductor region further comprises a fourth doped layer of semiconductor material being more highly doped than the second doped layer, and wherein the fourth doped layer is formed on the second doped layer and is in direct electrical contact with the second section of the gate electrode.

9. The transistor of claim 2, wherein the barrier region comprises a first main surface and a recess extending away from the first main surface, and wherein the first doped semiconductor region is formed in the recess.

10. A high electron mobility transistor, comprising:
a buffer region;
a barrier region adjoining and extending along the buffer region, the buffer and barrier regions being formed from semiconductor materials having different band-gaps such that an electrically conductive channel comprising a two-dimensional charge carrier gas arises at an interface between the buffer and barrier regions due to piezoelectric effects; and
a gate structure being configured to control a conduction state of the channel and comprising an electrically conductive gate electrode and an RC network integrated into the gate structure,
wherein the RC network comprises first and second capacitors and a resistor,
wherein the first and second capacitors are connected between the gate electrode and the channel in a series configuration, and wherein the resistor is connected in parallel with the first capacitor and in series with the second capacitor.

11. The transistor of claim 10, wherein the first capacitor is in direct electrical contact with the gate electrode and a first node, wherein the second capacitor is in direct electrical contact with the first node and the barrier region, and wherein the resistor is in direct electrical contact with the with the gate electrode and the first node.

12. The transistor of claim 11, wherein the gate structure comprises a first doped semiconductor region arranged on the barrier region and a second doped semiconductor region arranged on the first doped semiconductor region, wherein the first capacitor is formed by a first p-n junction between first doped semiconductor region and the barrier region, and wherein the second capacitor is formed by a second p-n junction between the first doped semiconductor region and the second doped semiconductor region.

13. The transistor of claim 12, wherein the first doped semiconductor region comprises a first doped layer of semiconductor material being formed on the barrier region, wherein the second doped semiconductor region comprises a second doped layer of semiconductor material being formed on the first doped semiconductor region, and wherein the resistor is formed by a section of the first doped layer that is physically isolated from the first doped semiconductor region.

14. The transistor of claim 13, wherein the resistor has a resistance of at least 500Ω, wherein capacitance values of the first and second capacitances are such that a ratio between a dominant pole time constant of the RC network and a zero time constant of the RC network is between 1.5 and 0.5, wherein the dominant pole time constant equals the resistance of the resistor multiplied with the total capacitance of the first and second capacitors, and wherein the zero time constant equals the resistance of the resistor multiplied with the capacitance of the second capacitor.

15. The transistor of claim 14, wherein the resistor is provided by a plurality of rectangular shaped sections of the first doped layer being connected in parallel with one another.

16. A high electron mobility transistor, comprising:
a buffer region;
a barrier region adjoining and extending along the buffer region, the buffer and barrier regions being formed from semiconductor materials having different band-gaps such that an electrically conductive channel comprising a two-dimensional charge carrier gas arises at an interface between the buffer and barrier regions due to piezoelectric effects;
source and drain electrodes being spaced apart from one another and in ohmic contact with the channel;
a gate structure being configured to control a conduction state of the channel, the gate structure comprising an electrically conductive gate electrode, a first diode, a second diode, and a resistor,
wherein the gate structure is configured such that the channel is in a conductive state at a positive gate-source potential and a non-conductive state at zero gate-source potential,
wherein the first diode is arranged to be forward biased at the positive gate-source potential,
wherein the second diode is arranged to be reverse biased at the positive gate-source potential, and
wherein the only connection between the gate electrode and the first diode at a positive gate-source potential is through the resistor.

17. The transistor of claim 16, wherein the gate structure comprises a first doped semiconductor region arranged on the barrier region and a second doped semiconductor region arranged on the first doped semiconductor region, wherein the first diode is formed by a first p-n junction between first doped semiconductor region and the barrier region, and wherein the second diode is formed by a second p-n junction between the first doped semiconductor region and the second doped semiconductor region.

18. The transistor of claim 17, wherein the first doped semiconductor region comprises a first doped layer of semiconductor material being formed on the barrier region, wherein the second doped semiconductor region comprises a second doped layer of semiconductor material being formed on the first doped semiconductor region, and wherein the resistor is formed by a section of the first doped layer that is physically isolated from the first doped semiconductor region.

19. The transistor of claim 18, wherein the resistor is formed by a plurality of rectangular sections of the first doped layer, and wherein each of the rectangular sections in the plurality are electrically connected with the first and second sections of the gate electrode, and wherein each of the rectangular sections are physically separated from the first doped semiconductor region by a passivation layer that is formed on the barrier region.

20. The transistor of claim 19, wherein each of the rectangular sections in the plurality is connected in parallel with one another and has a resistance of between 50 kΩ and 150 kΩ, and wherein the resistor has a resistance of between 500Ω and 10 kΩ.

* * * * *

UNITED STATES PATENT AND TRADEMARK OFFICE
CERTIFICATE OF CORRECTION

| | | |
|---|---|---|
| PATENT NO. | : 9,305,917 B1 | Page 1 of 1 |
| APPLICATION NO. | : 14/674096 | |
| DATED | : April 5, 2016 | |
| INVENTOR(S) | : G. Curatola et al. | |

It is certified that error appears in the above-identified patent and that said Letters Patent is hereby corrected as shown below:

In the claims

Column 15, line 25 (claim 11 line 5), please change "with the with the" to -- with the --

Signed and Sealed this
Twenty-eighth Day of June, 2016

Michelle K. Lee
*Director of the United States Patent and Trademark Office*